United States Patent
Mizoguchi et al.

(10) Patent No.: US 9,269,532 B2
(45) Date of Patent: Feb. 23, 2016

(54) CHARGED PARTICLE BEAM WRITING APPARATUS, AND METHOD FOR DETECTING IRREGULARITIES IN DOSE OF CHARGED PARTICLE BEAM

(71) Applicant: NUFLARE TECHNOLOGY, INC., Yokohama (JP)

(72) Inventors: Hironori Mizoguchi, Yokohama Kanagawa (JP); Hideo Inoue, Miura Kanagawa (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 14/709,200

(22) Filed: May 11, 2015

(65) Prior Publication Data
US 2015/0325407 A1 Nov. 12, 2015

(30) Foreign Application Priority Data
May 12, 2014 (JP) ................................ 2014-099012

(51) Int. Cl.
*G21K 5/04* (2006.01)
*H01J 37/244* (2006.01)
*H01J 37/317* (2006.01)

(52) U.S. Cl.
CPC ........... *H01J 37/244* (2013.01); *H01J 37/3174* (2013.01)

(58) Field of Classification Search
USPC .......... 250/396 R, 397, 492.1, 492.2, 492.21, 250/492.22, 492.23, 492.3
See application file for complete search history.

(56) References Cited

U.S. PATENT DOCUMENTS

| 2009/0050802 A1* | 2/2009 | Noji et al. ..................... 250/307 |
| 2012/0037802 A1* | 2/2012 | Kneedler ..................... 250/307 |
| 2013/0230806 A1* | 9/2013 | Ozawa et al. ................. 430/296 |

FOREIGN PATENT DOCUMENTS

JP 2012-114127 A 6/2012

* cited by examiner

*Primary Examiner* — Nicole Ippolito
(74) *Attorney, Agent, or Firm* — Patterson & Sheridan LLP.

(57) ABSTRACT

A charged particle beam writing apparatus includes a first limiting aperture member, in which a first opening is formed, to block a charged particle beam having been blanking-controlled to be beam "off", and to let a part of the charged particle beam having been blanking-controlled to be beam "on" pass through the first opening, a first detector to detect a first electron amount irradiating the first limiting aperture member, in a state where beam "on" and beam "off" are repeated, a first integration processing unit to generate a first integrated signal by integrating components in a band sufficiently lower than a band of a repetition cycle of beam "on" and beam "off", in a first detected signal detected for obtaining the first electron amount, and a first irregularity detection unit to detect irregularity in a dose amount of the charged particle beam by using the first integrated signal.

11 Claims, 10 Drawing Sheets

CHARGED PARTICLE BEAM WRITING APPARATUS, AND METHOD FOR DETECTING IRREGULARITIES IN DOSE OF CHARGED PARTICLE BEAM

CROSS-REFERENCE TO RELATED APPLICATION

This application is based upon and claims the benefit of priority from the prior Japanese Patent Application No. 2014-099012 filed on May 12, 2014 in Japan, the entire contents of which are incorporated herein by reference.

BACKGROUND OF THE INVENTION

1. Field of the Invention

Embodiments of the present invention relate generally to a charged particle beam writing apparatus and a method for detecting irregularities in dose of charged particle beam. More specifically, for example, the embodiments relate to an apparatus and method that detects irregularities in the amount of dose of charged particle beam.

2. Description of Related Art

In recent years, with high integration of LSI, the line width (critical dimension) required for circuits of semiconductor devices is becoming progressively narrower. As a method for forming an exposure mask (also called a reticle) used to form circuit patterns in these semiconductor devices, the electron beam (EB) writing technique having excellent resolution is employed.

Figure 10:
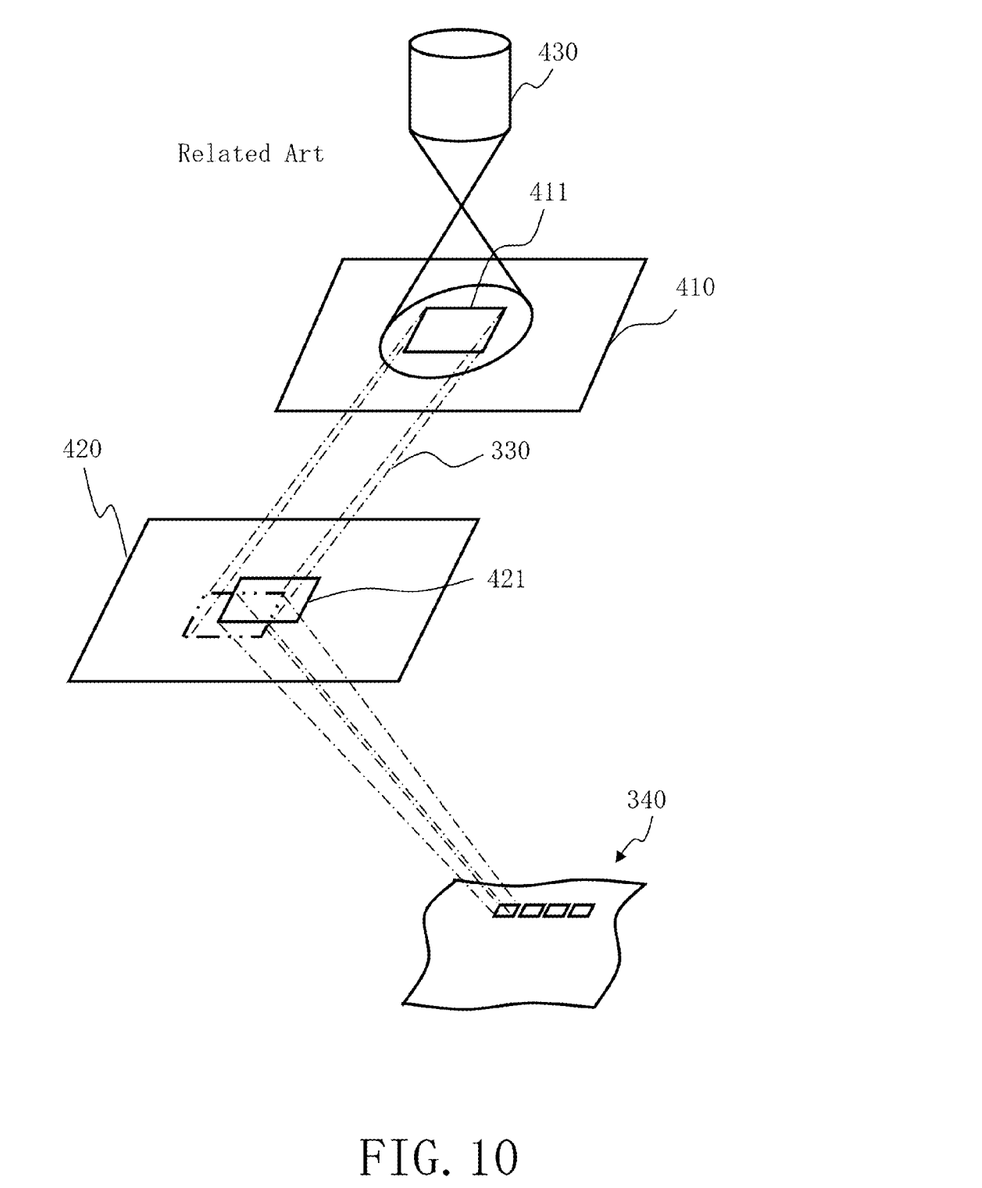
FIG. 10 is a conceptual diagram explaining operations of a variable shaped electron beam writing apparatus.

FIG. 10 is a conceptual diagram explaining operations of a conventional variable shaped electron beam writing or "drawing" apparatus. The variable shaped electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

With the increase in accuracy of an electron beam writing apparatus, demand for improvement in accuracy of detecting writing irregularities is also increased. Therefore, it has been requested to detect even a change of an extremely small amount of dose. Then, in order to detect dose irregularities, it is desirable to directly measure an electron beam during the writing. However, naturally, the electron beam concerned to be measured is being used for writing processing. Therefore, it is difficult to directly measure an electron beam being used for writing.

For example, there is disclosed a method for detecting an irregularity in an electron beam immediately after emitted from an electron gun according to which irregularities are detected by measuring a current amount of beam irradiating a limiting aperture member arranged just below the electron gun (refer to, e.g., Japanese Published Unexamined Patent Application (JP-A) No. 2012-114127).

However, in the variable shaped electron beam (VSB) writing, since a beam shot is sequentially formed while the beam "on" and beam "off" states are alternately repeated, a change occurs in an electron beam by the blanking operation. Accordingly, there is a problem that it is difficult to detect a change of an extremely small amount of dose in such a state.

BRIEF SUMMARY OF THE INVENTION

According to one aspect of the present invention, a charged particle beam writing apparatus includes an emission unit configured to emit a charged particle beam, a blanker configured to provide blanking control to obtain one of a beam "on" state and a beam "off" state by deflecting the charged particle beam, a first limiting aperture member, in which a first opening is formed, configured to block the charged particle beam having been blanking controlled to be the beam "off" state, and to let a part of the charged particle beam having been blanking controlled to be the beam "on" state pass through the first opening, a first detector configured to detect a first electron amount irradiating the first limiting aperture member, in a state in which the beam "on" state and the beam "off" state are repeated, a first integration processing unit configured to generate a first integrated signal by integrating components in a band sufficiently lower than a band of a repetition cycle of the beam "on" state and the beam "off" state, in a first detected signal detected for obtaining the first electron amount, and a first irregularity detection unit configured to detect an irregularity in an amount of dose of the charged particle beam by using the first integrated signal.

According to another aspect of the present invention, a method for detecting an irregularity in dose of charged particle beam includes detecting an electron amount irradiating a limiting aperture member when in a state in which a beam "on" state and a beam "off" state are repeated, by using the limiting aperture member, in which an opening is formed and which blocks a charged particle beam having been blanking controlled to be the beam "off" state and lets a part of a charged particle beam having been blanking control to be the beam "on" state pass through the opening, generating an integrated signal by integrating components in a band sufficiently lower than a band of a repetition cycle of the beam "on" state and the beam "off" state, in a detected signal detected for obtaining the electron amount, and detecting an irregularity in an amount of dose of the charged particle beam by using the integrated signal.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used. Moreover, a variable shaped electron beam writing apparatus will be described as an example of a charged particle beam apparatus.

In the following embodiments, there will be described an apparatus and method that can detect an irregularity of an extremely small amount of dose even when a beam change occurs by the blanking operation.

First Embodiment

Figure 1:
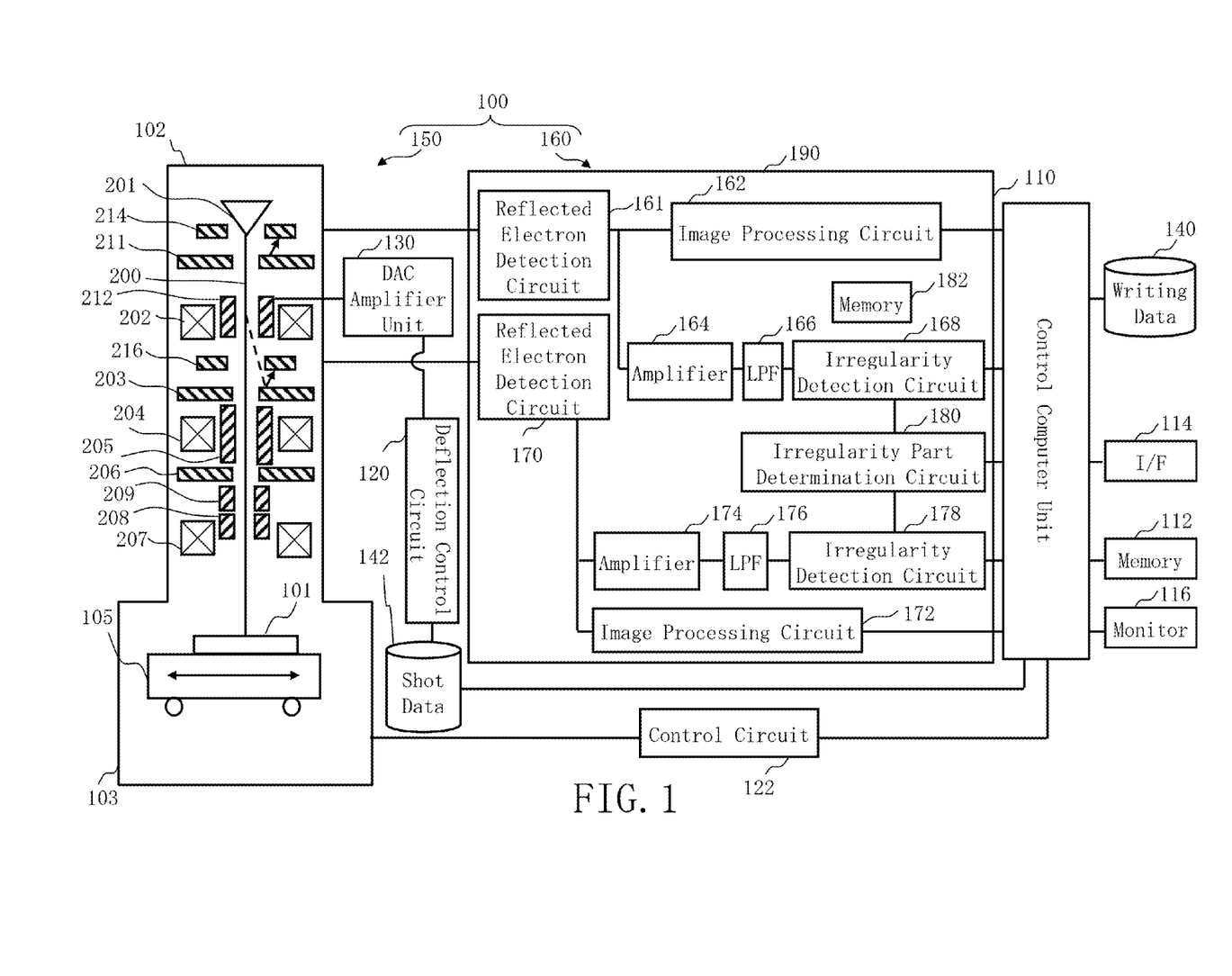
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a charged particle beam writing apparatus, and particularly, an example of a variable shaped beam (VSB) writing apparatus. The writing unit 150 includes an electron optical column 102 and a writing chamber 103. In the electron optical column 102, there are arranged an electron gun assembly 201, a detector 214, a limiting aperture plate 211, an illumination lens 202, a blanking deflector (blanker) 212, a detector 216, a first shaping aperture plate 203, a projection lens 204, a deflector 205, a second shaping aperture plate 206, an objective lens 207, a main deflector 208 and a sub deflector 209. In the writing chamber 103, there is arranged an XY stage 105 that is movable at least in the x-y direction. On the XY stage 105, there is placed a target object or "sample" 101 (substrate) which serves as a writing target and on which resist has been applied. The target object 101 is an exposure mask, a silicon wafer, and the like used for manufacturing semiconductor devices. The mask may be, for example, a mask blank.

The control unit 160 includes a control computer unit 110, a memory 112, an external interface (I/F) circuit 114, a monitor 116, a deflection control circuit 120, a control circuit 122, a DAC (digital-analog converter) amplifier unit 130 (deflection amplifier), storage devices 140 and 142 such as magnetic disk drives, and a dose irregularity detector unit 190.

The control computer unit 110, the memory 112, the external interface (I/F) circuit 114, the monitor 116, the deflection control circuit 120, the control circuit 122, the storage devices 140 and 142, and the dose irregularity detector unit 190 are connected with each other through a bus (not shown). The deflection control circuit 120 is connected to the DAC amplifier unit 130 which is connected to the blanking deflector 212.

In the dose irregularity detector unit 190, there are arranged a reflected electron detection circuit 161, an image processing circuit 162, an amplifier 164, a low pass filter (LPF) 166, an irregularity detection circuit 168, a reflected electron detection circuit 170, an image processing circuit 172, an amplifier 174, a low pass filter (LPF) 176, an irregularity detection circuit 178, an irregular part determination circuit 180 and a memory 182. Each function, such as the reflected electron detection circuit 161, the image processing circuit 162, the amplifier 164, the LPF 166, the irregularity detection circuit 168, the reflected electron detection circuit 170, the image processing circuit 172, the amplifier 174, the LPF 176, the irregularity detection circuit 178, and the irregular part determination circuit 180 may be configured by software such as a program causing a computer to implement these functions or by hardware such as an electron circuit. Alternatively, they may be configured by a combination of hardware and software. Input data which is needed in the dose irregularity detector unit 190 or an operated result is stored in the memory 182 each time. A computer such as a CPU or GPU is arranged when at least one of the reflected electron detection circuit 161, the image processing circuit 162, the amplifier 164, the LPF 166, the irregularity detection circuit 168, the reflected electron detection circuit 170, the image processing circuit 172, the amplifier 174, the LPF 176, the irregularity detection circuit 178, and the irregular part determination circuit 180 is configured by software.

The reflected electron detection circuit 161 is connected to the detector 214. Outputs of the reflected electron detection circuit 161 are output to the image processing circuit 162 and the amplifier 164. Outputs of the amplifier 164 are output to the LPF 166. Outputs of the LPF 166 are output to the irregularity detection circuit 168.

The reflected electron detection circuit 170 is connected to the detector 216. Outputs of the reflected electron detection circuit 170 are output to the image processing circuit 172 and the amplifier 174. Outputs of the amplifier 174 are output to the LPF 176. Outputs of the LPF 176 are output to the irregularity detection circuit 178.

Writing data is input from the outside and stored in the storage device 140.

FIG. 1 shows a configuration necessary for explaining the first embodiment. Other configuration elements generally necessary for the writing apparatus 100 may also be included.

Figure 2:
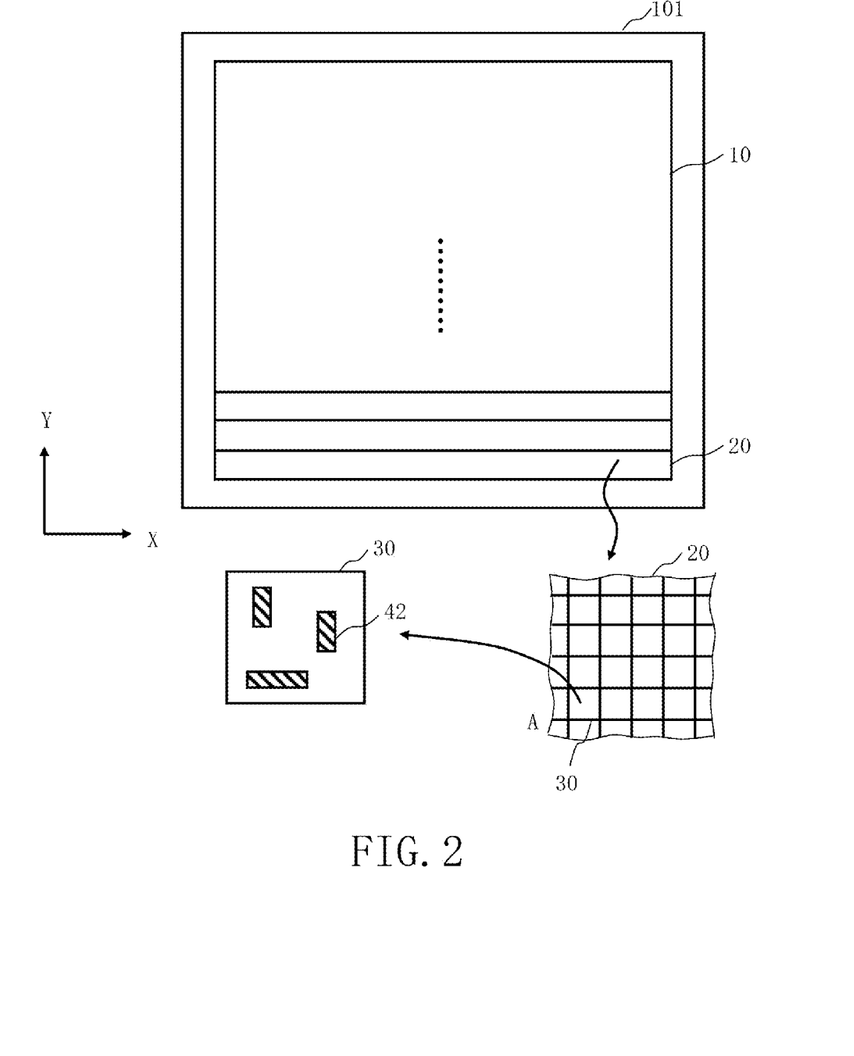
FIG. 2 is a conceptual diagram for explaining each region according to the first embodiment.

FIG. 2 is a conceptual diagram for explaining each region according to the first embodiment. In FIG. 2, a writing region 10 of the target object 101 is virtually divided into a plurality of stripe regions 20 arrayed, for example, along the y direction, each being in a strip shape and each having a width deflectable by the main deflector 208. Further, each of the stripe regions 20 is virtually divided into a plurality of mesh-like subfields (SFs) 30 (small regions) each having a size deflectable by the sub deflector 209. A shot figure is written at a corresponding shot position 42 in each SF 30. Although, in the example of FIG. 2, the SF 30 is the minimum deflection region, it is not limited thereto. For example, each SF may be further divided virtually into a plurality of small mesh-like under subfields (TF: Tertiary Field). In that case, a sub-sub deflector should be further arranged as the third stage deflector in addition to the two-stage deflector composed of the main deflector and the sub deflector.

The writing apparatus 100 performs writing processing in each stripe region 20 by using a multiple stage deflector. Here, as an example, a two-stage deflector composed of the main deflector 208 and the sub deflector 209 is used. While the XY stage 105 is continuously moving, for example, in the −x direction, a pattern is written in the x direction in the first stripe region 20. After the pattern writing in the first stripe region 20 has been completed, a pattern is written in the same or opposite direction in the second stripe region 20. Then, in the same way, patterns are written in the third and subsequent stripe regions 20. The main deflector 208 deflects the electron beam 200 in sequence to a reference position A of the SF 30 concerned so as to follow the movement of the XY stage 105. The sub deflector 209 deflects the electron beam 200 from the reference position A of each SF 30 to each shot position 42 of an irradiating beam in the SF 30 concerned. Thus, the sizes of the deflection regions of the main deflector 208 and the sub deflector 209 are different from each other.

Figure 3:
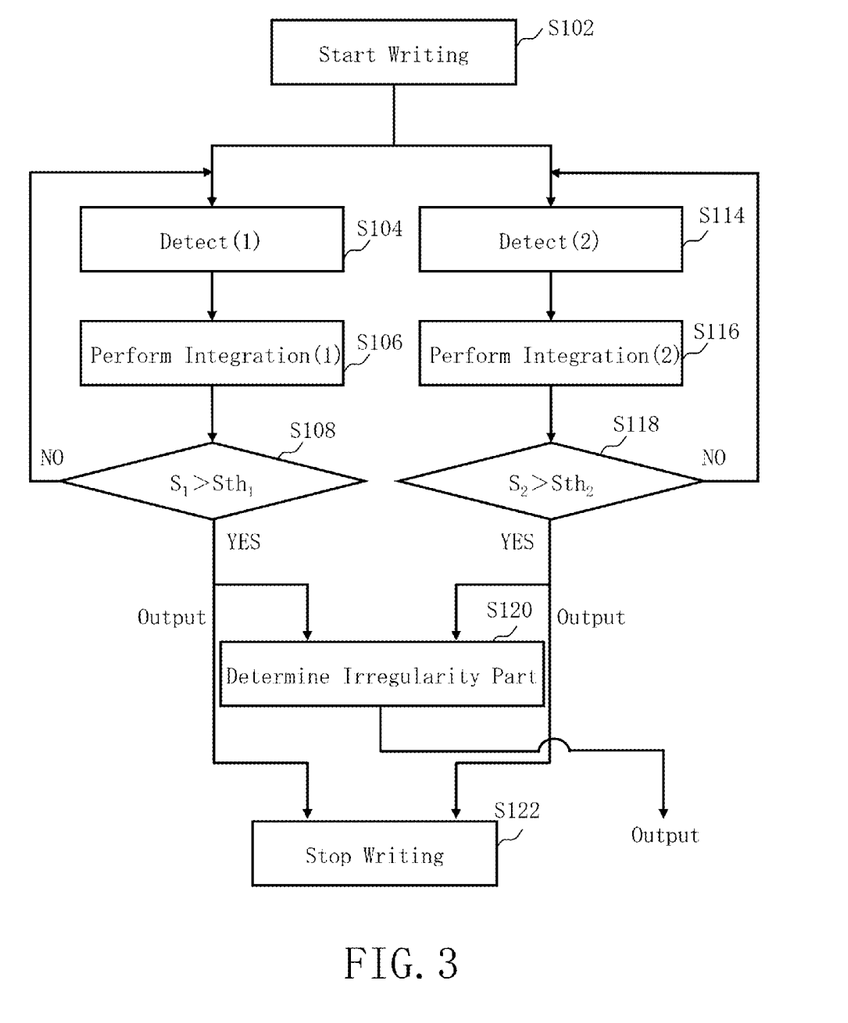
FIG. 3 is a flowchart showing main steps of a writing method according to the first embodiment.

FIG. 3 is a flowchart showing main steps of a writing method according to the first embodiment. In FIG. 3, the writing method of the first embodiment executes a series of steps: a writing start step (S102), a detection (1) step (S104), an integration processing (1) step (S106), a determination step (S108), a detection (2) step (S114), an integration processing (2) step (S116), a determination step (S118), an irregular part determination step (S120), and a writing stop processing step (S122). Main steps of a method for detecting irregularities in the dose according to the first embodiment is configured by the detection (1) step (3104), the integration processing (1) step (S106), the determination step (S108), the detection (2) step (S114), the integration processing (2) step (S116), the determination step (S118), and the irregular part determination step (S120). Moreover, a series of processing of the detection (1) step (S104), the integration processing (1) step (S106), and the determination step (S108) is performed in parallel with a series of processing of the detection (2) step (S114), the integration processing (2) step (S116), and the determination step (S118).

In the writing start step (S102), first, the control computer unit 110 reads writing data stored in the storage device 140, and performs data conversion processing of a plurality of steps so as to generate apparatus-specific shot data for the writing apparatus 100. The file structure of the writing data is formed, for example, for each frame region obtained by virtually dividing the chip region of a writing target chip into strip-like regions. The data file for each frame region is read in sequence to generate shot data. It is preferable that each frame region is corresponding to each stripe region 20 serving as a writing unit region. However, it is not limited thereto. For example, it is also preferable to obtain regions by dividing a stripe region. Moreover, although a plurality of figure patterns are arranged in a chip, the size which can be formed by one beam shot is restricted in the writing apparatus 100. Therefore, each figure pattern is divided into shot figures each having a size that can be irradiated by one beam shot. A figure type, figure size, position, and the like of each shot figure are generated as shot data. In addition, shot data defines an irradiation time (dose, irradiation amount) for irradiation of each shot figure. For example, the dose may be a value having been modulated to correct a dimensional variation resulting from a proximity effect, etc. The shot data is stored in sequence in the storage device 142.

The control computer unit 110 starts writing processing by controlling the writing unit 150 through the deflection control circuit 120 and the control circuit 122. The writing unit 150 writes a pattern on the target object 101 with the electron beam 200 based on the irradiation time defined in the shot data. Specifically, it operates as described below. The deflection control circuit 120 acquires an irradiation time from the shot data stored in the storage device 142. Then, the deflection control circuit 120 generates a digital signal for blanking control which controls the irradiation time of each shot, and outputs it to the DAC amplifier unit 130. The DAC amplifier unit 130 converts the digital signal to an analog signal and amplifies it to be applied as a deflection voltage to the blanking deflector 212.

With respect to the electron beams 200 emitted from the electron gun assembly 201 (an emission unit), a portion of the electron beams 200 other than a portion of the electron beams 200 of the region where the current density is almost uniform is blocked by the limiting aperture plate 211. That is, beam passage is restricted by letting only a portion of the electron beams 200 of the region where the current density is almost uniform pass. The electron beam 200 having passed through the limiting aperture plate 211 irradiates the whole of the first shaping aperture plate 203 which has a quadrangular opening, by the illumination lens 202. At this stage, the electron beam 200 is first shaped to be a quadrangle. On this occasion, when the beam passes through the blanking deflector 212, a part of the beam is controlled to pass through the first shaping aperture plate 203 by the blanking deflector 212 when in the beam "on" state, and the entire beam is deflected to be blocked by the first shaping aperture plate 203 when in the beam "off" state. Thus, the blanking deflector 212 (blanker) performs blanking control to be the beam "on" state or the beam "off" state by deflecting the electron beam 200. The electron beam 200 that has passed through the first shaping aperture plate 203 during the period from becoming a beam "on" state from a beam "off" state to again becoming a beam "off" state serves as one shot of the electron beam. The blanking deflector 212 controls the direction of the passing electron beam 200 to alternately generate a beam "on" state and a beam "off" state. For example, when in a beam "on" state, no voltage is applied to the blanking deflector 212, and, when in a beam "off" state, a voltage should be applied to it. The dose per shot of the electron beam 200 to irradiate the target object 101 is adjusted depending upon an irradiation time of each shot.

Then, after passing through the first shaping aperture plate 203, the electron beam 200 of the first aperture image is projected onto the second shaping aperture plate 206 by the projection lens 204. The first aperture image on the second shaping aperture plate 206 is deflection-controlled by the deflector 205 so as to change (variably shape) the shape and size of the beam. Such variable beam shaping is performed for each shot, and, generally, each shot is shaped to have a different shape and size. Then, after passing through the second shaping aperture plate 206, the electron beam 200 of the second aperture image is focused by the objective lens 207, and deflected by the main deflector 208 and the sub deflector 209 so as to reach a desired position on the target object 101 placed on the XY stage 105 which moves continuously. The main deflector 208 deflects the beam to a reference position in an SF 30 to be written while following the movement of the stage, and the sub deflector 209 deflects the beam to a writing position in the SF from the reference position of the SF 30. As described above, a plurality of shots of the electron beam 200 are deflected in sequence by each deflector onto the target object 101 being a substrate.

Figure 4A:
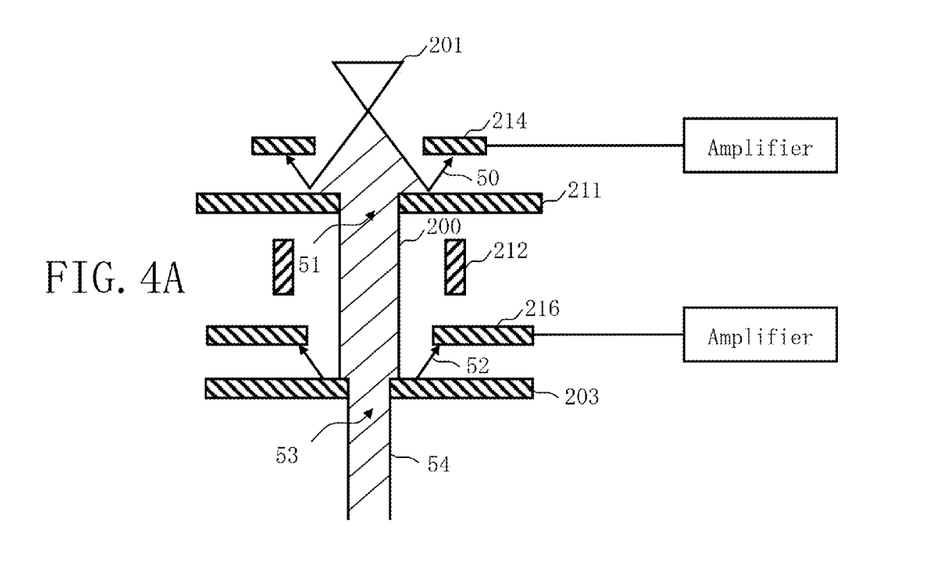
FIGS. 4A and 4B illustrate a method for detecting irregularities in the amount of dose according to the first embodiment.
Figure 4B:
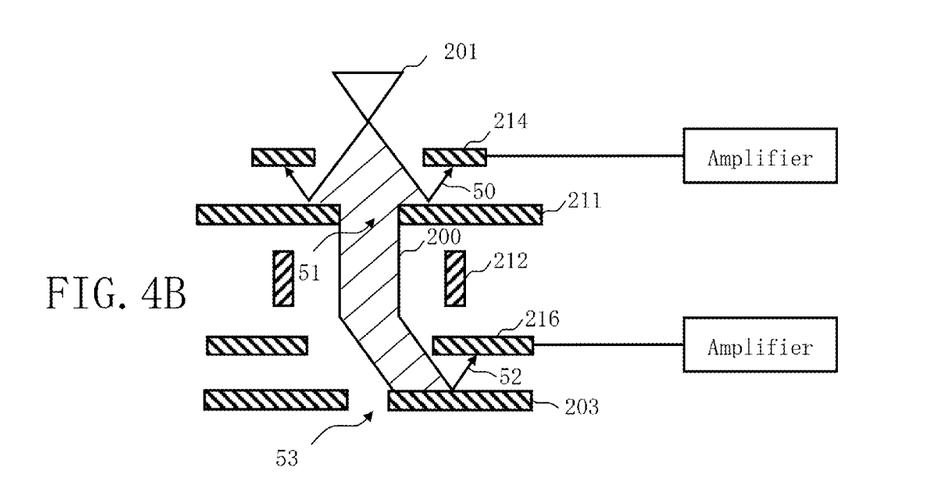

FIGS. 4A and 4B illustrate a method for detecting irregularities in the amount of dose according to the first embodiment. FIG. 4A illustrates the beam "on" state, and FIG. 4B illustrates the beam "off" state. The operation of detecting a dose amount irregularity is performed in the state in which the beam "on" and the beam "off" are alternately repeated. A quadrangular opening 53 (first opening) is formed in the first shaping aperture plate 203. As shown in FIG. 4A, a beam 54 being a part of the electron beam 200 which is blanking-controlled to be the beam "on" state passes through the opening 53 of the first shaping aperture plate 203, and, as shown in FIG. 4B, the electron beam 200 (the entire beam) which is blanking-controlled to be the beam "off" state is blocked by the first shaping aperture plate 203.

In the detection (1) step (S104), using the first shaping aperture plate 203 (an example of a first limiting aperture member), the detector 216 (first detector) detects an electron amount (first electron amount) irradiating the first shaping aperture plate 203 in the state in which beam "on" and beam "off" are repeated. This electron amount (first electron amount) is measured by detecting a reflected electron 52 from the first shaping aperture plate 203. The electron to be detected is not limited to the reflected electron 52, and it may be at least one of the reflected electron 52 (first reflected electron) and a secondary electron (first secondary electron). In the examples of FIGS. 4A and 4B, the reflected electron 52 is shown as an example. In the beam "on" state, since the beam 54 passing through the opening 53 (first opening) is not detected, the reflected electron 52 (or secondary electron) which is generated when the surface of the first shaping aperture plate 203 is irradiated by the remaining beams of the electron beam 200 is detected. In the beam "off" state, since the entire electron beam 200 is blocked by the first shaping aperture plate 203, the reflected electron 52 (or secondary electron) generated when the surface of the first shaping aperture plate 203 is irradiated by the entire electron beam 200 is detected. The reflected electron 52 (or secondary electron) is detected while the beam "on" and beam "off" operations are performed based on the shot cycle of the time t (for example, on the order of several tens of nanoseconds). The detected signal is converted from the current signal to the voltage signal, and also, the detected signal is converted to a digital signal in the reflected electron detection circuit 170. By this, a smaller value is output when in the beam "on" state in which the detected electron amount is small compared with the beam "off" state in which the detected electron amount is large. Therefore, it is possible to be virtually in accordance with the blanking operation state (in the beam "on" and beam "off" states). Then, the digital signal is output to the image processing circuit 172 and the amplifier 174.

Image processing of the detected signal is performed in the image processing circuit 172. Then, the control computer unit 110 displays the image of the detected signal on the monitor 114. Thereby, the user can view the signal image. On the other hand, the amplifier 174 amplifies the detected signal and outputs it to the LPF 176.

Figure 5A:
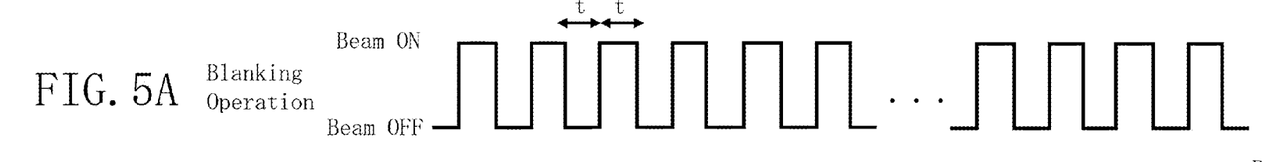
FIGS. 5A to 5C show an example of the relation among a blanking operation, a detected signal and a dose amount on the surface of a target object according to the first embodiment.
Figure 5B:
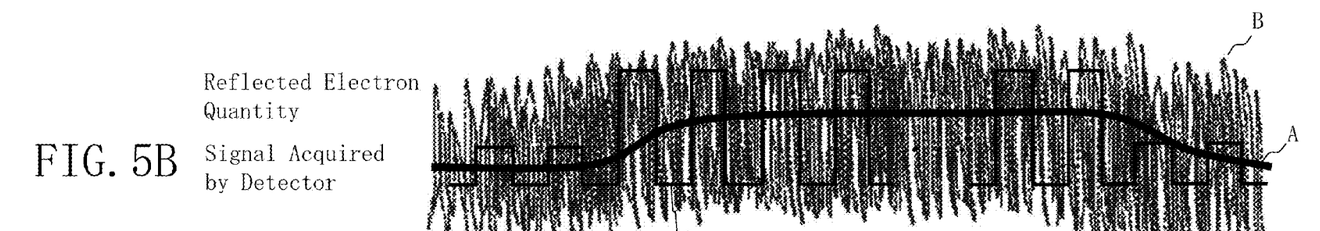
Figure 5C:
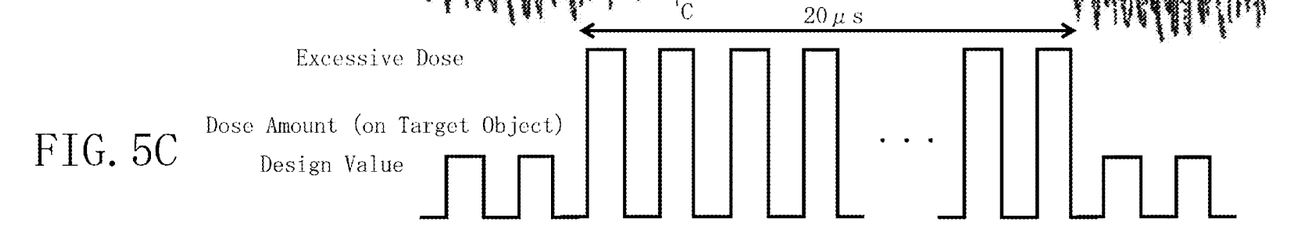

FIGS. 5A to 5C show an example of the relation among a blanking operation, a detected signal and a dose amount on the surface of the target object according to the first embodiment. FIG. 5A shows a blanking (BLK) operation. FIG. 5B shows a detected signal. In FIG. 5B, a larger value is indicated when in the beam "on" state compared with the beam "off" state in order to adapt to the orientation of the blanking (BLK) operation. Specifically, FIG. 5B shows a theoretical graph C that should be drawn by a detected signal when an irregularity occurs because the dose amount is excessively larger than a design value during writing. However, since a graph B of an actually measured detected signal superimposes a high frequency noise due to a high speed switching operation between beam "on" and beam "off" by a blanking operation and due to other effects, it is difficult to distinguish between a detected amount in the beam "on" state and a detected amount in the beam "off" state as shown in FIG. 5B. Accordingly, it is difficult to determine irregularities of a dose. Thus, according to the first embodiment, filtering processing is performed as described below.

In the integration processing (1) step (S106), the LPF 176 (first integration processing unit) generates an integrated signal (first integrated signal) by integrating components in a band sufficiently lower than the band of the repetition cycle of beam "on" and beam "off", in a detected signal (first detected signal) detected for obtaining the reflected electron 52 (or secondary electron). By integrating components in a band sufficiently lower than the band of the repetition cycle of beam "on" and beam "off" in a detected signal (first detected signal), a graph A of an integrated signal indicating a change of an electron amount without being affected by the blanking operation can be obtained as shown by the thick line of FIG. 5B. In other words, the LPF 176 may generate an integrated signal by integrating components in a band lower than the band of the high frequency noise which the actually measured detected signal superimposes. The band of the high frequency noise may be obtained by an experiment or a simulation.

Figure 6A:
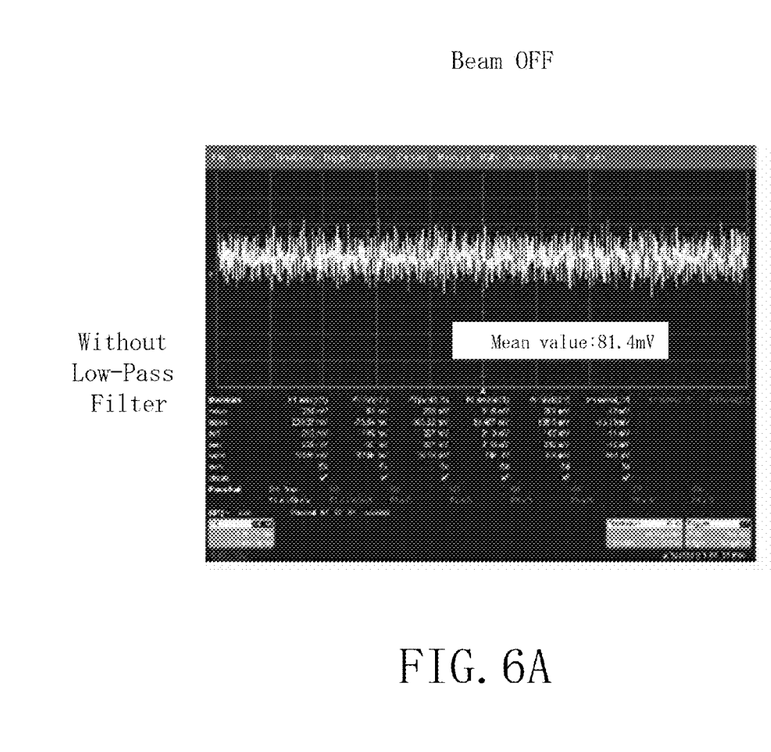
FIGS. 6A and 6B show an example of a detected signal before filtering processing according to the first embodiment.
Figure 6B:
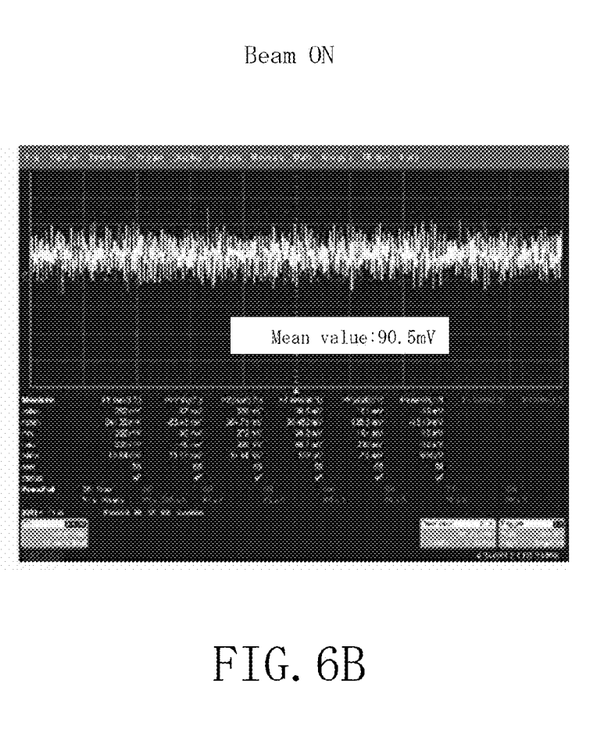

FIGS. 6A and 6B show an example of a detected signal before filtering processing according to the first embodiment. FIG. 6A shows a result in the beam "off" state, and FIG. 6B shows a result in the beam "on" state.

Figure 7A:
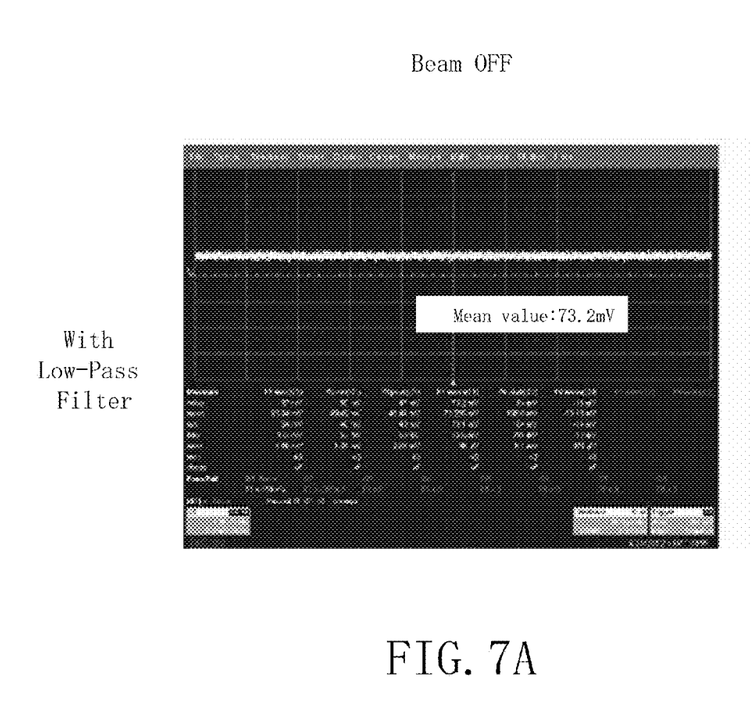
FIGS. 7A and 7B show an example of a detected signal after filtering processing according to the first embodiment.
Figure 7B:
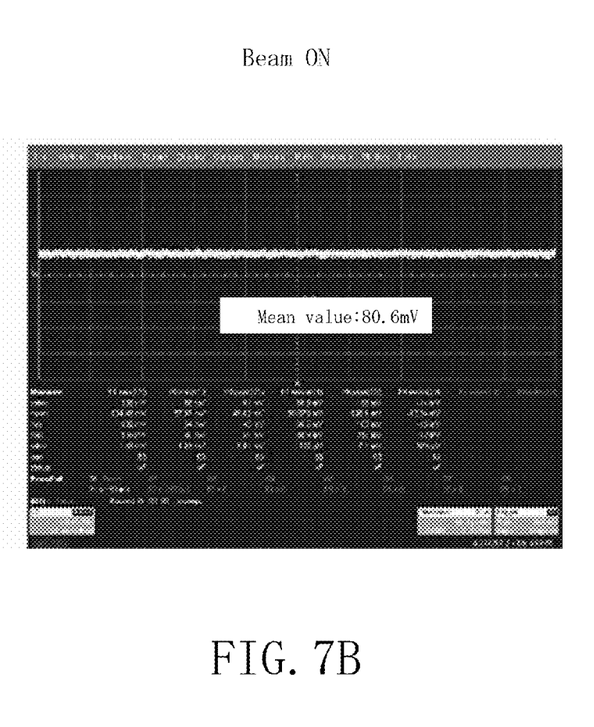

FIGS. 7A and 7B show an example of a detected signal after filtering processing according to the first embodiment. FIG. 7A shows a result in the beam "off" state, and FIG. 7B shows a result in the beam "on" state.

Comparing the graphs of FIGS. 6A and 6B, the states of a detected signal are almost the same. Furthermore, it can be known that it is difficult to distinguish between FIGS. 6A and 6B if a change of a minute amount of dose occurs. On the other hand, by using a graph of an integrated signal as shown in FIGS. 7A and 7B, although it is difficult to distinguish between beam "on" and beam "off", almost a linear graph can be obtained.

Even when an irregularity occurs in a dose during writing and the dose amount (irradiation amount) of the entire beam has been increased by a minute amount, the value of an integrated signal A of the graph shown by the thick line of FIG. 5B increases in accordance with the change of the dose amount. FIG. 5C shows an example of the dose amount (irradiation amount) applied to the surface of the target object 101. The dose amount on the surface of the target object 101 shown in FIG. 5C also changes in accordance with the change of the integrated signal of the graph A shown by the thick line of FIG. 5B. Thus, by taking notice of the change of the integrated signal graph A, it becomes possible to capture a change in a dose amount.

In the determination step (S108), the irregularity detection circuit 178 (first irregularity detection unit) detects an irregularity in a dose amount of the electron beam 200 by using an integrated signal (first integrated signal). Specifically, the irregularity detection circuit 178 determines that there is an irregularity when the value of the integrated signal (first integrated signal) exceeds a threshold value Dth. By using the value of an integrated signal, comparison with the threshold value Dth to make determination can be performed.

Figure 8:
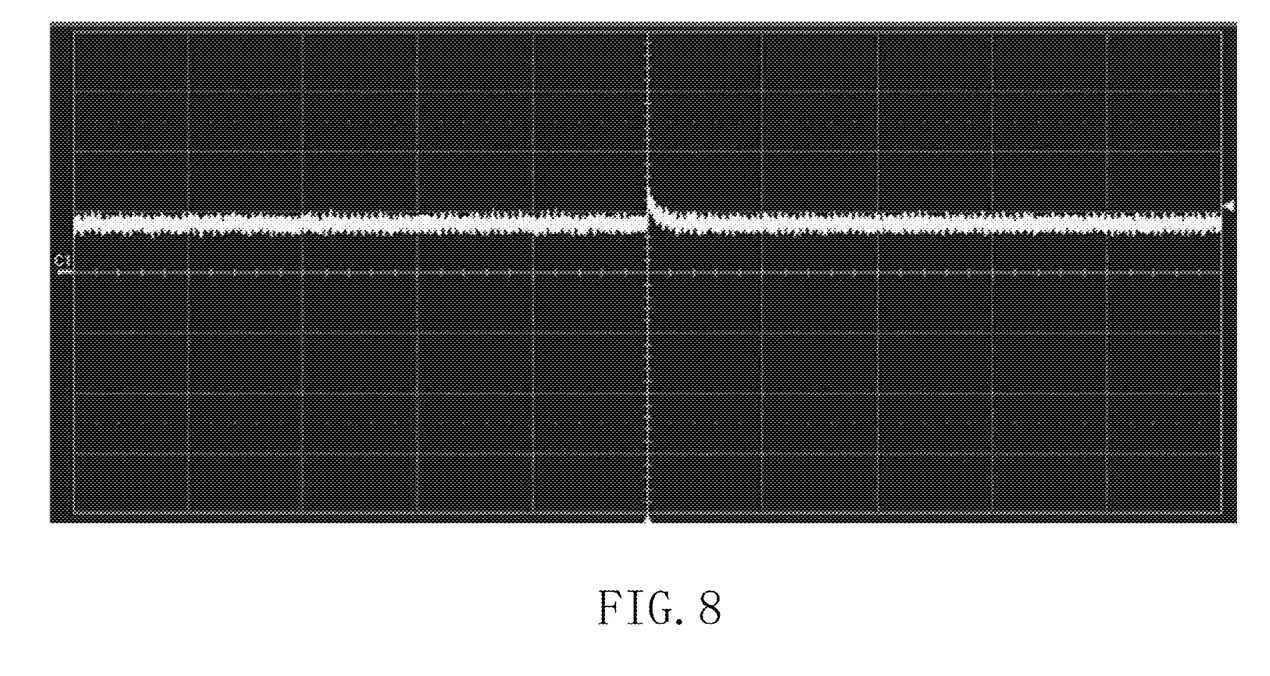
FIG. 8 shows an example of a detected signal after filtering processing including a time at which a dose irregularity occurs according to the first embodiment.

FIG. 8 shows an example of a detected signal after filtering processing including a time at which a dose irregularity occurs according to the first embodiment. In FIG. 8, an integrated signal increases at the center portion of the graph, which shows an irregularity in the dose amount.

According to what is described above, even when a beam change occurs by a blanking operation, an irregularity of an extremely small amount of dose can be detected. Therefore, the precision of detecting irregularities in writing can be improved. Here, it is possible to detect that an irregularity occurs in the dose at a position at least up to close to the blanking deflector 212. However, there is a case that an irregularity occurs in the dose at the upstream side (electron gun assembly 201 side) of the blanking deflector 212 with respect to the optical axis direction. Then, according to the first embodiment, a dose amount irregularity of the beam at the stage before the beam change by the blanking operation is also detected.

In the detection (2) step (S114), using the limiting aperture plate 211 (an example of a second limiting aperture member), the detector 214 (second detector) detects an electron amount (second electron amount) irradiating the limiting aperture plate 211. This electron amount (second electron amount) is measured by detecting a reflected electron 50 from the limiting aperture plate 211. The electron to be detected is not limited to the reflected electron 50, and it may be at least one of the reflected electron 50 (second reflected electron) and a secondary electron (second secondary electron). In the examples of FIGS. 4A and 4B, the reflected electron 50 is shown as an example. A circular or quadrangular opening 51 (second opening) is formed at the center of the limiting aperture plate 211. The limiting aperture plate 211 is arranged between the electron gun assembly 201 and the blanking deflector 212, and lets a part of the emitted electron beam 200 pass through the opening 51. Since the beam passing through the opening 51 is not detected, the detector 214 detects the reflected electron 50 (or secondary electron) generated when the surface of the limiting aperture plate 211 is irradiated by the remaining beams of the electron beam 200. Thus, since the limiting aperture plate 211 is arranged at the upstream side of the blanking deflector 212 that performs a blanking operation, if there is no irregularity in a dose, the dose should be substantially fixed regardless of beam "on" and beam "off". The detected signal is converted from the current signal to the voltage signal, and also, the detected signal is converted to a digital signal in the reflected electron detection circuit 161. Then, the digital signal is output to the image processing circuit 162 and the amplifier 164.

Image processing of the detected signal is performed in the image processing circuit 162. Then, the control computer unit 110 displays the image of the detected signal on the monitor 114. Thereby, the user can view the signal image. On the other hand, the amplifier 164 amplifies the detected signal and outputs it to the LPF 166.

In the integration processing (2) step (S116), the LPF 166 (second integration processing unit) generates an integrated signal (second integrated signal) by integrating components in a band sufficiently lower than the band of the repetition cycle of beam "on" and beam "off", in a detected signal (second detected signal) detected for obtaining the reflected electron 50 (or secondary electron). By this processing, the state of the signal can be under the same condition as that of outputs of the LPF 176. In other words, the LPF 166 may generate an integrated signal by integrating components in a band lower than the band of the high frequency noise which the actually measured detected signal superimposes. The band of the high frequency noise may be obtained by an experiment or a simulation.

In the determination step (S118), the irregularity detection circuit 168 (second irregularity detection unit) detects an irregularity in the amount of dose of the electron beam 200 by using an integrated signal (second integrated signal). Specifically, the irregularity detection circuit 168 determines that there is an irregularity when the value of the integrated signal (second integrated signal) exceeds a threshold value Dth'. By using the value of an integrated signal, comparison with the threshold value Dth' to make determination can be performed by the value from which a noise component has been removed.

According to what is described above, an irregularity of an extremely small amount of dose can be detected in the case where no beam change occurs by a blanking operation.

In the irregular part determination step (S120), the irregular part determination circuit 180 (irregular part determination unit) determines an irregular part (or "irregular position") in a dose amount of the electron beam 200 by using an integrated signal (first integrated signal) and another integrated signal (second integrated signal). Specifically, when an irregularity is detected by an integrated signal (first integrated signal) and no irregularity is detected by another integrated signal (second integrated signal), the irregular part determination circuit 180 determines that the dose irregular part is near the blanking deflector 212. When an irregularity is detected by an integrated signal (first integrated signal) and also by another integrated signal (second integrated signal), the irregular part determination circuit 180 determines that the dose irregular part is near the electron gun assembly 201. When an irregularity is detected by an integrated signal (second integrated signal) and no irregularity is detected by an integrated signal (first integrated signal), the irregular part determination circuit 180 determines that there is a system failure.

In the writing stop processing step (S122), the control computer unit 110 (writing control unit) controls each device to stop writing processing when a dose amount irregularity of an electron beam is detected. Then, the writing unit 150 stops writing processing by this control. Thus, it is possible to prevent from continuing to write on the target object 101 (mask) while there is an irregularity in the dose. Writing of the target object 101 takes a long time, such as 24 hours. Since an irregularity in a dose amount can be detected, it becomes possible to avoid generation of a useless time.

As described above, according to the first embodiment, even when a beam change occurs by a blanking operation, an irregularity of an extremely small amount of dose can be detected. Therefore, the precision of detecting irregularities in writing can be improved. Furthermore, an irregular part can be specified. Thereby, a recovery time can be shortened. Accordingly, the apparatus operating rate can be increased, and, further, the apparatus throughput can be improved.

Second Embodiment

In the above first embodiment, the amount of electrons irradiating the first shaping aperture plate 203, etc. is measured by detecting the reflected electron 52 from the first shaping aperture plate 203, etc., but it is not limited thereto. In the 30 second embodiment, the detection is performed by another method.

Figure 9:
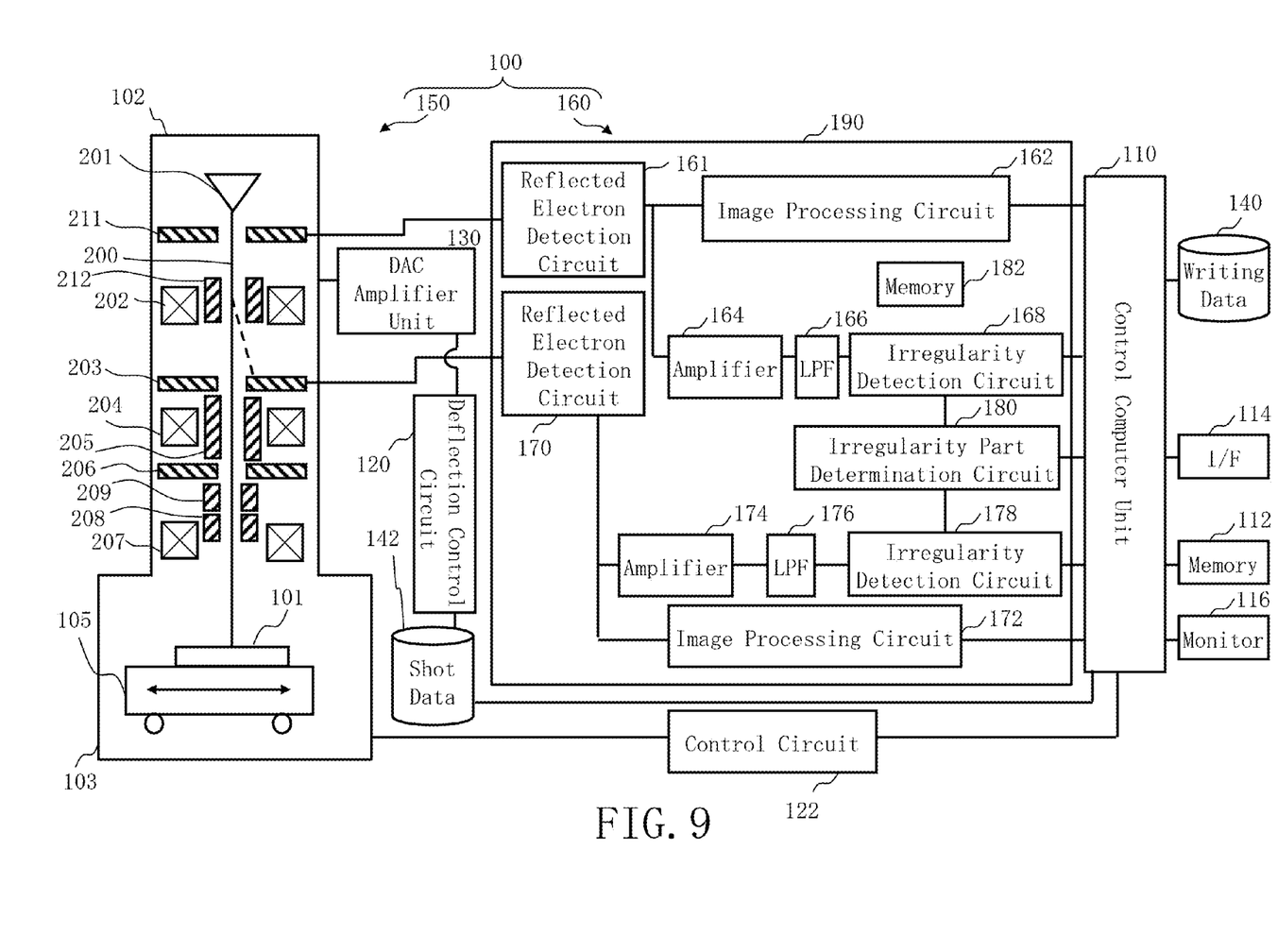
FIG. 9 is a schematic diagram showing the configuration of a writing apparatus according to a second embodiment.

FIG. 9 is a schematic diagram showing the configuration of a writing apparatus according to the second embodiment. FIG. 9 is the same as FIG. 1 except that the detectors 214 and 216 are not provided, the reflected electron detection circuit 161 is connected to the limiting aperture plate 211, and the reflected electron detection circuit 170 is connected to the first shaping aperture plate 203. Moreover, the writing method according to the second embodiment is the same as that of FIG. 3.

In the second embodiment, the amount of electrons irradiating the first shaping aperture plate 203 is detected by the first shaping aperture plate 203 itself. Similarly, the amount of electrons irradiating the limiting aperture plate 211 is detected by the limiting aperture plate 211 itself. The other contents are the same as those of the first embodiment. The same effect as that of the first embodiment can be obtained by the second embodiment.

The embodiments have been explained referring to concrete examples described above. However, the present invention is not limited to these specific examples.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus, and method for detecting irregularities in the amount of dose of charged particle beam that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   an emission unit configured to emit a charged particle beam;
   a blanker configured to provide blanking control to obtain one of a beam "on" state and a beam "off" state by deflecting the charged particle beam;
   a first limiting aperture member, in which a first opening is formed, configured to block the charged particle beam having been blanking controlled to be the beam "off" state, and to let a part of the charged particle beam having been blanking controlled to be the beam "on" state pass through the first opening;
   a first detector configured to detect a first electron amount irradiating the first limiting aperture member, in a state in which the beam "on" state and the beam "off" state are repeated;
   a first integration processing unit configured to generate a first integrated signal by integrating components in a band sufficiently lower than a band of a repetition cycle of the beam "on" state and the beam "off" state, in a first detected signal detected for obtaining the first electron amount; and
   a first irregularity detection unit configured to detect an irregularity in an amount of dose of the charged particle beam by using the first integrated signal.

2. The apparatus according to claim 1, wherein the first irregularity detection unit determines that there is an irregularity, in a case where a value of the first integrated signal exceeds a threshold value.

3. The apparatus according to claim 1 further comprising:
   a second limiting aperture member, in which a second opening is formed, arranged between the emission unit and the blanker and configured to let a part of the charged particle beam having been emitted pass through the second opening;
   a second detector configured to detect a second electron amount irradiating the second limiting aperture member;
   a second integration processing unit configured to generate a second integrated signal by integrating components in a band sufficiently lower than the band of the repetition cycle of the beam "on" state and the beam "off" state, in a second detected signal detected for obtaining the second electron amount;
   a second irregularity detection unit configured to detect an irregularity in an amount of dose of the charged particle beam by using the second integrated signal; and
   an irregular part determination unit configured to determine an irregular part of the amount of the dose of the charged particle beam by using the first and second integrated signals.

4. The apparatus according to claim 1 further comprising:
   a writing control unit configured to control to stop writing processing, in a case where the irregularity in the amount of dose of the charged particle beam is detected.

5. The apparatus according to claim 1, wherein
   the first detector is arranged at an upstream side of the first limiting aperture member with respect to a direction of an optical axis of the charged particle beam, and
   the first electron amount is detected by detecting one of a reflected electron and a secondary electron reflected from the first limiting aperture member.

6. The apparatus according to claim 1, wherein the first limiting aperture member corresponds to a first shaping aperture member, in the first shaping aperture member and a second shaping aperture member that variably shape the charged particle beam.

7. The apparatus according to claim 1, wherein the second detector detects the second electron amount by detecting one of a reflected electron and a secondary electron reflected from the second limiting aperture member.

8. The apparatus according to claim 7, wherein the second limiting aperture member is arranged at an upstream side of the first limiting aperture member with respect to a direction of an optical axis of the charged particle beam.

9. The apparatus according to claim 1, wherein the first integration processing unit generates the integrated signal by integrating components in a band lower than a band of a high frequency noise which an actually measured detected signal superimposes.

10. A method for detecting an irregularity in dose of charged particle beam comprising:
    detecting an electron amount irradiating a limiting aperture member when in a state in which a beam "on" state and a beam "off" state are repeated, by using the limiting aperture member, in which an opening is formed and which blocks a charged particle beam having been blanking controlled to be the beam "off" state and lets a part of a charged particle beam having been blanking control to be the beam "on" state pass through the opening;
    generating an integrated signal by integrating components in a band sufficiently lower than a band of a repetition cycle of the beam "on" state and the beam "off" state, in a detected signal detected for obtaining the electron amount; and
    detecting an irregularity in an amount of dose of the charged particle beam by using the integrated signal.

11. A charged particle beam writing apparatus comprising:
    an emission means for emitting a charged particle beam;
    a blanking control means for providing blanking control to obtain one of a beam "on" state and a beam "off" state by deflecting the charged particle beam;
    a first limiting aperture member in which a first opening is formed and which blocks the charged particle beam having been blanking controlled to be the beam "off" state and lets a part of the charged particle beam having been blanking control to be the beam "on" state pass through the first opening;

a first detection means for detecting a first electron amount irradiating the first limiting aperture member, in a state in which the beam "on" state and the beam "off" state are repeated;

a first integration processing means for generating a first integrated signal by integrating components in a band sufficiently lower than a band of a repetition cycle of the beam "on" state and the beam "off" state, in a first detected signal detected for obtaining the first electron amount; and a first irregularity detection means for detecting an irregularity in an amount of dose of the charged particle beam by using the first integrated signal.

* * * * *